United States Patent
Hsu et al.

(10) Patent No.: US 12,012,335 B2
(45) Date of Patent: Jun. 18, 2024

(54) PREPARATION METHOD AND WORKING ELECTRODE APPLICATION OF 3D BUNDLE-SHAPED MULTI-WALLED CARBON NANOTUBES

(71) Applicant: Kun Shan University, Tainan (TW)

(72) Inventors: Hao-Lin Hsu, Tainan (TW); Jean-Hong Chen, Tainan (TW)

(73) Assignee: KUN SHAN UNIVERSITY, Tainan (TW)

( * ) Notice: Subject to any disclaimer, the term of this patent is extended or adjusted under 35 U.S.C. 154(b) by 491 days.

(21) Appl. No.: 17/503,488

(22) Filed: Oct. 18, 2021

(65) Prior Publication Data

US 2023/0122386 A1   Apr. 20, 2023

(51) Int. Cl.
  *H01M 4/133*   (2010.01)
  *B01J 19/14*   (2006.01)
  (Continued)

(52) U.S. Cl.
  CPC .............. *C01B 32/162* (2017.08); *B01J 19/14* (2013.01); *B01J 21/08* (2013.01); *B01J 23/8872* (2013.01); *B01J 37/04* (2013.01); *B01J 37/08* (2013.01); *B01J 37/18* (2013.01); *C23C 16/26* (2013.01); *H01M 4/0428* (2013.01); *H01M 4/133* (2013.01); *C01B 2202/06* (2013.01); *C01B 2202/22* (2013.01)

(58) Field of Classification Search
  CPC . B01J 19/14; B01J 21/08; B01J 23/462; B01J 23/6562; B01J 23/78; B01J 23/8872; B01J 23/8892; B01J 23/8913; B01J 37/04; B01J 37/08; B01J 37/18; C01B 2202/06; C01B 2202/22; C01B 32/162; C23C 16/26; C23C 16/4418; H01G 11/36; H01G 11/86; H01M 4/0428; H01M 4/0471; H01M 4/133; H01M 4/625; H01M 4/661; H01M 4/663; H01M 4/667; Y02E 60/13
  See application file for complete search history.

(56) References Cited

PUBLICATIONS

Pitkanen et al., "Low temperature growth of carbon nanotubes on bi and tri-metallic catalyst templates", Topics in Catalysis (2013), 56:522-526 (Year: 2013).*

* cited by examiner

*Primary Examiner* — Victoria H Lynch
(74) *Attorney, Agent, or Firm* — WPAT, P.C

(57) ABSTRACT

3D bundle-shaped multi-walled carbon nanotubes and preparation method, includes the following steps: uniformly mixing bi-component alloy catalyst and transition metal in an inert gas environment in order to obtain a three-component nano-intermetallic alloy catalyst; disposing the intermetallic catalyst on the substrate; allowing hydrogen to flow through the substrate, and heating the substrate to a first temperature, and using the hydrogen to undergo a reduction of the intermetallic catalyst at the first temperature; applying a protective gas and a carbon source gas, heating the substrate to a second temperature, undergoing a reaction at the second temperature to generate the 3D bundle-shaped multi-walled carbon nanotubes, and collecting the 3D bundle-shaped multi-walled carbon nanotubes after annealing; wherein the second temperature is greater than or equal to the first temperature; a working electrode includes conductive drain material, a conductive bonding gent and a plurality of 3D bundle-shaped multi-walled carbon nanotubes.

13 Claims, 7 Drawing Sheets

(51) Int. Cl.
  *B01J 21/08* (2006.01)
  *B01J 23/887* (2006.01)
  *B01J 37/04* (2006.01)
  *B01J 37/08* (2006.01)
  *B01J 37/18* (2006.01)
  *C01B 32/162* (2017.01)
  *C23C 16/26* (2006.01)
  *H01M 4/04* (2006.01)

PREPARATION METHOD AND WORKING ELECTRODE APPLICATION OF 3D BUNDLE-SHAPED MULTI-WALLED CARBON NANOTUBES

BACKGROUND OF THE INVENTION

1. Technical Field

The present invention is related to a preparation method of nanotubes, and in particular, to a preparation method of bundle-shaped multi-walled carbon nanotubes, and also to relevant application methods of electrodes of three-dimensional (3D) bundle-shaped multi-walled carbon nanotubes.

2. Description of Related Technology

Carbon nanotubes (CNTs) were initially discovered by Dr Sumio Iijima at Nippon Electric Company (NEC) during his use of the electric arc discharge method to perform Fullerenes synthesis experiment in 1991. During the experiment, when transmission electron microscope was use to observe the carbon clusters, it was found that they were mostly multi-walled carbon nanotubes, and the tubular materials were formed by curved graphite surfaces. In addition, their structures were divided into two types of Single-Walled Carbon Nanotubes (SWCNTs) and Multi-Walled Carbon Nanotubes (MWCNTs). Furthermore, the SWCNTs were found during the synthesis of, carbon nanocapsules containing magnetic metals (Fe, Co, Ni) in 1993.

Due to the nano effect of large specific surface area and Van Der Waals force, SWCNTs mostly exist in the form of bundle-shaped arrangement, and multi-walled carbon nanotubes mostly exist in the form of SWCNTs. In recent years, new mechanism for growth of multi-walled carbon nanotubes mainly with bundle-shaped arrangement has been developed. Such new mechanism does not utilize the Van Der Waals force to allow the MWCNTs to form bundle-shaped arranged but utilizes catalyst for attaching and arranging on the layered carrier, followed by using the chemical vapor deposition (CVD) method to perform carbon nanotubes growth in order to achieve the result. Such type of carbon nanotubes growth mechanism mostly utilizes Ni/Mg/Mo series of mixed alloy as the metal catalyst. For example, under high temperature, carbon source air is provided to flow on top a substrate containing metal particles of $MoO_4$ or $MoO_3$, in order to perform generation of carbon nanotubes via the CVD method. As shown in FIG. 1, the mechanism for generation of carbon nanotubes via the CVD method is briefly illustrated, and it mainly utilizes the metal catalyst distributed on top of the substrate as the source for the growth of carbon nanotubes. After hydrocarbons or graphite rods undergo pyrolysis at high temperature, they are deposited at the metal catalyst root bottom. The vaporized carbon source continues to deposit from the bottom of the metal catalyst and gradually pushes the metal particles upward, thereby forming hollow carbon nanotubes. The growth mechanism of the hollow carbon nanotubes is as shown in FIG. 2.

However, for the carbon nanotubes generated via the aforementioned method, the Raman Spectroscopy result indicates that the carbon-carbon double bond and amorphous carbon strength ratio is smaller than $1(I_G/I_D<1)$, meaning that the structure of amorphous carbon is greater than graphite structure, and it is necessary to perform purification treatment in order to obtain bundle-shaped carbon nanotubes of higher purity, leading to a time-consuming process with an increase of cost.

Supercapacitor using electrode active material or porous material to store electrical energy is equipped with outstanding energy storage characteristic, and different from traditional chemical cell, supercapacitor is a power source that is between traditional capacitor and battery while exhibiting special performance, such that it is able to perform charging and discharging repetitively for hundreds of thousands of times. In comparison to supercapacitor, traditional capacitor has high power density but its deliverable energy density is low. On the other hand, supercapacitor's energy density is higher, useful lifetime is longer, discharging/charging time is shorter and the working temperature range is broader.

In the past, typically, various types of conductive materials have been used for coating of supercapacitors of paper material in order to increase the energy density. However, such method often results in reduction of power density. Accordingly, a simple process that is capable of increasing the energy density while maintaining the power density at the same time is a method commonly sought by both the industry and academic sectors nowadays.

According to the Self-Assembled Hierarchical Formation of Conjugated 3D Cobalt Oxide Nanobead-CNT-Graphene Nanostructure Using Microwaves for High-Performance Supercapacitor Electrode published by Kumar et al in the U.S. ACS (Applied Materials & Interfaces) in 2015, it indicates that active cathode electrode material mainly consists of carbon material, comprising activated carbon, carbon fibers, carbon nanotubes, carbon aerogels, graphene and carbide derived carbons, etc. In addition, the selection and structure of cathode electrode material have certain level of impact on the energy storage capacity of capacitor. The electrochemical performance of a three-dimensional (3D) structure synthesizes 3D self-assembly layered nano-structure, and such structure is composed of zero-dimensional (0D) cobaltous oxide nanospheres (Co-nb), one-dimensional (1D) carbon nanotubes (CNT) and two-dimensional (2D) graphene nanosheets (GNS), which is used for high performance supercapacitor electrode application. Such type of 3D self-assembly layered nano-structure $Co_3O_4$ nanosphere-CNTs-GNSs (3D: Co-nb @ CG) can achieve large scale of growth through simple, convenient and ultra-fast microwave radiation. In 3D: Co-nb @ CG nano-structure, $Co_3O_4$ nanospheres are attached to the CNT surface with growth of GNS, allowing the cobaltous oxide and CNT to grow on the graphene nanosheets at the same time, and the inherent dispersion characteristic of the carbon nanotubes and cobaltous oxide can be established in the high conductive frame, such that 3D: Co-nb @ CG electrode is able to demonstrate greater electrochemical performance. When the charging/discharging current density in KOH electrolyte is 0.7 A/g, the maximum specific capacitance is 600 F/g, which is 1.56 times higher than the modified $Co_3O_4$ of graphene (Co-np @ G) nano-structure. Accordingly, such electrode synergistic effect seems to be able to enhance the electrochemical performance.

According to the one-step solvothermal method for synthesizing $NiCo_2S_4$/CNTs (NCS/CNTs) hybridized nanostructure disclosed by Sajjad et al in the High Energy Density Asymmetric Supercapacitor Based on $NiCo_2S_4$/CNTs Hybrid and Carbon Nanotube Paper Electrodes, when it is used as the electrode material of supercapacitor for evaluation, the synthesized NCS/CNT-1 composite hybridized structure, demonstrating that the capacitance under the current density of 5 A g$^{-1}$ is 1,690 F g$^{-1}$. Most importantly, it uses NCS/CNT-1 as the positive electrode and carbon nanotube paper as the negative electrode for assembly, thereby providing a high energy density of 58 Wh kg$^{-1}$ under the power density of 8 kW kg$^{-1}$. Therefore, it can be inferred that the significant increase of the electrochemical performance is based on excellent mechanical stability, high conductivity and change of volume during the charging/discharging process.

BRIEF SUMMARY OF THE INVENTION

For nanotubes generated from the CVD method, the three-component intermetallic catalyst disposed on the substrate is used as the source of growth of the carbon nanotubes. The carbon source undergoing pyrolysis and vaporized under high temperature gradually deposits at the root bottom portion of the metal catalyst and then gradually pushes the metal particles upward to form hollow carbon nanotubes. However, Raman Spectroscopy indicates that the carbon-carbon double bond and amorphous carbon strength ratio is less than 1 ($I_G/I_D$<1). To be more specific, it means that in the structure of carbon nanotubes, the structure of amorphous carbons is greater than the graphite structure. The carbon nanotubes generated via such method requires further purification treatment in order to obtain bundle-shaped carbon nanotubes of higher purity, resulting in a longer process time and an increase of production cost.

In addition, to allow supercapacitor to be equipped with excellent energy storage characteristic, technologies nowadays mostly use quasi capacitor produced with the use of transition metal or porous material of high specific surface area in order to produce such type of capacitor. Accordingly, supercapacitor, unlike traditional chemical cell, can be charged/discharged repetitively for hundreds of thousands of times, and is equipped with relatively higher energy density, longer useful lifetime, shorter charging/discharging time and broader working temperature range. In the past, various types of conductive materials are used for coating the supercapacitor electrode in order to increase the energy density; however, such method typically increases the equivalent series resistance ($R_s$) or the charge-transfer resistance ($R_{ct}$), such that the energy density or power density is decreased.

Accordingly, to overcome the aforementioned pending issues, the present invention discloses a simplified process for the preparation method of carbon nanotubes, and the carbon nanotubes prepared can be used for the preparation of working electrode of high energy density. Consequently, the working electrode prepared is able to maintain its power density after repetitive charging and discharging process, thereby overcoming the aforementioned issue commonly encountered and concerned by the industry and academic sectors.

In view of the above, an objective of the present invention is to provide a preparation method of 3D bundle-shaped multi-walled carbon nanotubes, comprising the following steps:

Step S1: providing a bi-component alloy catalyst and a transition metal, mixing uniformly in an inert gas environment and performing a heat treatment at a temperature of 100~180° C. for 30~90 minutes in order to obtain an intermetallic catalyst;

Step S2: providing a substrate, and disposing the intermetallic catalyst on the substrate;

Step S3: providing a hydrogen flowing through the substrate, heating the substrate to a first temperature, and using the hydrogen to undergo a reduction of the intermetallic catalyst at the first temperature for 15~45 minutes;

Step S4: providing a protective gas and a carbon source gas, heating the substrate to a second temperature, allowing the protective gas and the carbon source gas to flow through the substrate, undergoing a reaction at the second temperature for 30~90 minutes, thereby allowing carbon atoms generated from pyrolysis of the carbon source gas to deposit at a bottom of the intermetallic catalyst, and gradually generating a 3D bundle-shaped multi-walled carbon nanotubes; after completion of the reaction at the second temperature, cooling to room temperature and collecting the 3D bundle-shaped multi-walled carbon nanotubes; wherein the inert gas comprises a Group 18 element, the second temperature is greater than or equal to the first temperature, and a volume mixing ratio of the protective gas and the carbon source gas is 1:6~1:12.

In an embodiment of present invention, the alloy catalyst comprises platinum-ruthenium alloy (Pt—Ru), nickel-cobalt alloy (Ni—Co), nickel-magnesium alloy (Ni—Mg), manganese-platinum alloy phase (Mn—Pt), cobalt-platinum alloy (Co—Pt) or manganese-cobalt alloy (Mn—Co).

In an embodiment of the present invention, the transition metal element comprises cadmium, rhodium, palladium, and molybdenum.

In an embodiment of the present invention, the substrate comprises glass, quartz, ceramic, diamond, polyethylene terephthalate, polyethylene naphthalate or polyimide.

In an embodiment of the present invention, the carbon source gas comprises carbon monoxide, methane, acetylene, ethane, ethylene, propylene or propyne.

In an embodiment of the present invention, the protective gas contains hydrogen, nitrogen, ammonia or an inert gas, such as, helium (He), neon (Ne), argon (Ar), krypton (Kr), xenon (Xe), and radon (Rn).

In an embodiment of the present invention, the first temperature is 400~700° C.

In an embodiment of the present invention, the second temperature is 550~900° C.

Another objective of the present invention is to provide a 3D bundle-shaped multi-walled carbon nanotubes, prepared according to the aforementioned preparation method.

Still another objective of the present invention is to provide a working electrode, comprising: a conductive and drain material; a conductive bonding material disposed on top of the conductive and drain material; and a plurality of 3D bundle-shaped multi-walled carbon nanotubes disposed on top of the conductive bonding material; wherein the 3D bundled-shaped multi-walled carbon nanotubes are produced via the aforementioned preparation method of 3D bundled-shaped multi-walled carbon nanotubes.

In an embodiment of the present invention, the conductive and drain material is made of ITO conductive glass, FTO conductive glass, nickel foam net, lead plate, acid and alkali resistant carbon plate, conductive polymer composite material or stainless steel metal material; the conductive bonding agent comprises carbon tape, carbon cloth, graphite felt, carbon felt, graphite paper, carbon paper, graphite brush, carbon brush, conductive glue, conductive silver glue or conductive polymer.

In an embodiment of the present invention, the working electrode further comprises a conductive electrolyte provided during use of the working electrode; the conductive electrolyte comprises liquid, colloid, quasi solid, all solid, aqueous solution, polymer electrolyte and provided during use of an energy storage device.

The 3D bundle-shaped multi-walled carbon nanotubes produced via the preparation method of the present invention have at least the following merits:

1. The nano-intermetallic alloy catalyst prepared in the present invention requires a simple process method only, such that it does not require the high energy consumption process of calcination under high temperature or high pressure; instead, it can be obtained via uniform mixing and simple heating process in an inert gas environment.
2. The 3D bundle-shaped multi-walled carbon nanotubes prepared via the method of the present invention are 3D bundle-shaped multi-walled carbon nanotubes produced through three-component nano-intermetallic alloy growth, and its specific surface area is approximately 95.3 $m^2/g$; in general, it is at least 800 $m^2/g$ or more less than the specific surface area of activated carbon or graphene. Accordingly, the 3D bundle-shaped multi-walled carbon nanotubes prepared via the method of the present invention is equipped with a specific surface area much smaller than that of regular activated carbon or graphene.
3. The 3D bundle-shaped multi-walled carbon nanotubes prepared via the method of the present invention refer to the bottom root attachment between 1D bundle-shaped multi-walled carbon nanotubes and 2D layered alloy material, such that the conductivity of the multi-walled carbon nanotubes and layered alloy material is increased and the electric double layer ion distribution storage efficiency is increased, thereby effectively and significantly increase the electrode capacitance and energy density.
4. For the working electrode produced from the 3D bundle-shaped multi-walled carbon nanotubes prepared via the method of the present invention, during the charging/discharging test at constant current, it demonstrates excellent energy density and power density; therefore, the 3D bundle-shaped multi-walled carbon nanotubes prepared via the method of the present invention has the potential to be served as solid-state capacitor.
5. The 3D bundle-shaped multi-walled carbon nanotubes prepared via the method of the present invention is equipped with the synergistic effect of nano-structure and excellent mechanical stability along with high conductivity and is also equipped with layered structure, such that it is able to increase the electric double layer storage effect and is able to effectively increase the ion diffusion rate. Furthermore, during the charging/discharging process, the volume change is small, thereby significantly increasing the electrode capacitance and energy density performance of 3D bundle-shaped multi-walled carbon nanotubes.
6. The composite electrode specific capacitance retention rate of the 3D bundle-shaped multi-walled carbon nanotubes composite electrode prepared via the method of the present invention is higher than the initial specific capacitance retention rate, demonstrating excellent conductivity and low charge-transfer resistance, low ion resistance and promoting fast migration of electrolyte ions passing through the conductive 3D bundle-shaped multi-walled carbon nanotubes structure, thereby facilitating the fast charge transfer between the 3D bundle-shaped multi-walled carbon nanotubes composite electrode material and electrolyte.
7. For the composite working electrode of the 3D bundle-shaped multi-walled carbon nanotubes prepared via the method of the present invention, during the charging/discharging test at constant current, it demonstrates excellent energy density, power density and cycle use capacitance retention rate; therefore, the 3D bundle-shaped multi-walled carbon nanotubes prepared via the method of the present invention have the application potential to be used as supercapacitor, electric double layer capacitor, quasi capacitor, all-solid state capacitor and relevant energy storage element and electric core material.

DETAILED DESCRIPTION OF THE INVENTION

Figure 1:
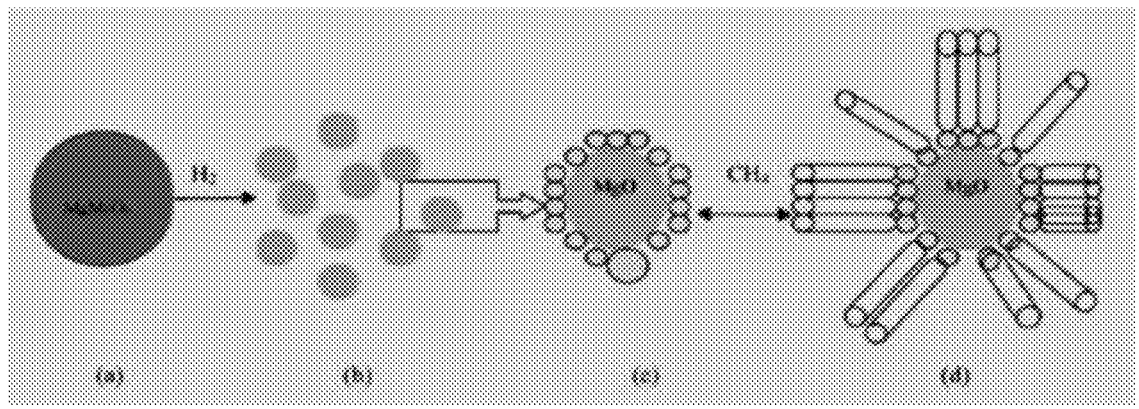
FIG. 1 is a schematic view illustrating the generation model of the bundle-shaped multi-walled carbon nanotubes with the use of $Mg/MoO_4$ catalyst growth.
Figure 2:
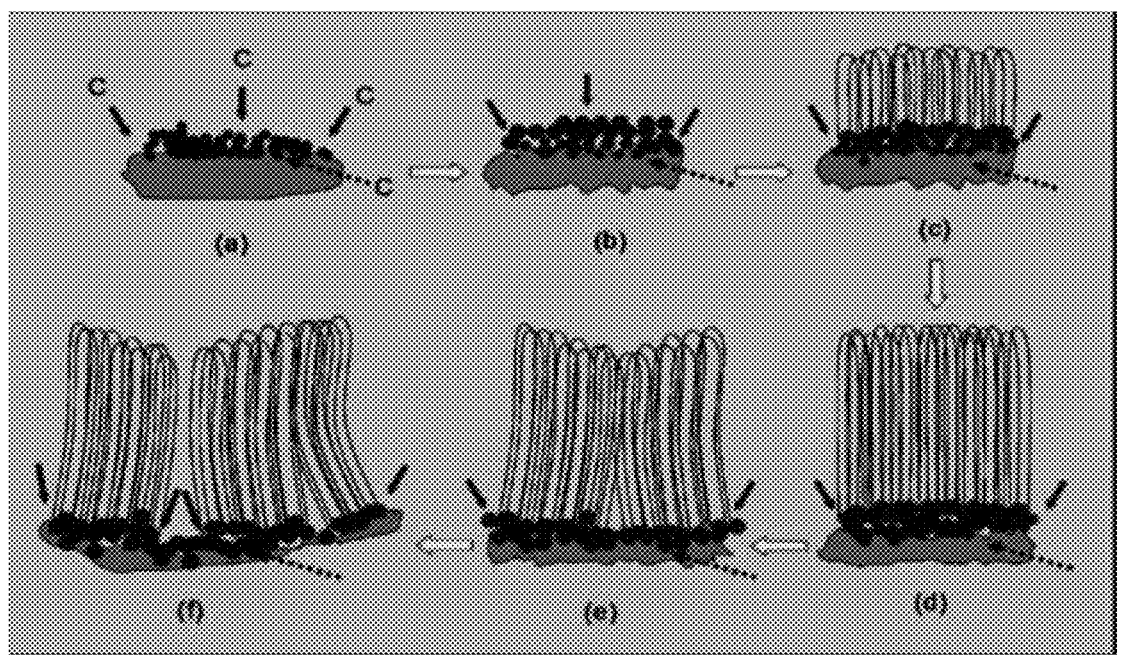
FIG. 2 is a schematic view illustrating the growth mechanism of the bundle-shaped multi-walled carbon nanotubes.
Figure 3:
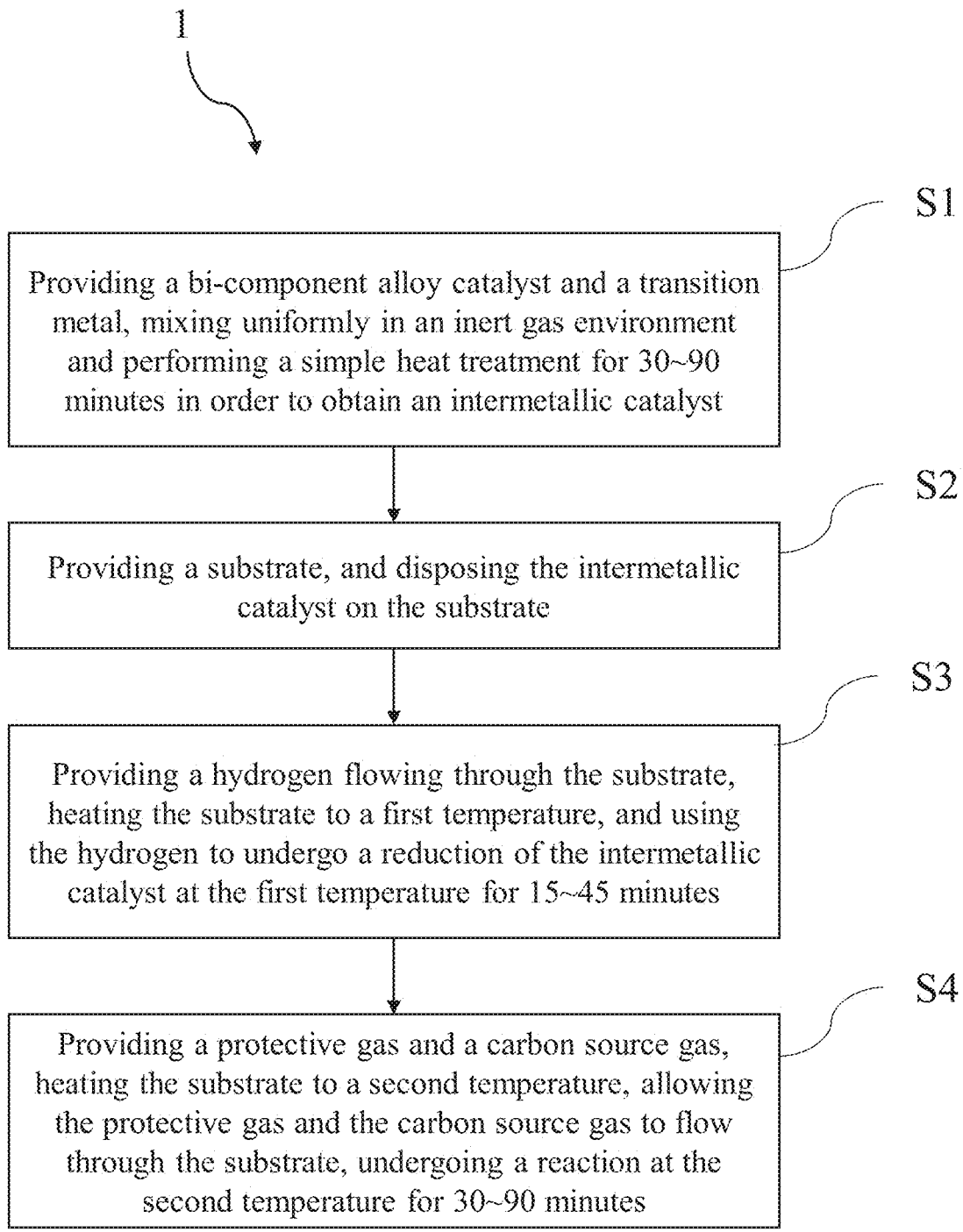
FIG. 3 is a flow chart illustrating a preparation method of a 3D bundle-shaped multi-walled carbon nanotubes of the present invention.

According to an embodiment of the present invention, a preparation method of 3D bundle-shaped multi-walled carbon nanotubes is provided. Please refer to FIG. 3, showing a flow chart of the preparation method. The preparation method comprises the following steps:

Step S1: providing a bi-component alloy catalyst and a transition metal, mixing uniformly in an inert gas environment and performing a simple heat treatment within a temperature of 180° C. for 30~90 minutes in order to obtain an intermetallic catalyst;

Step S2: providing a substrate, and disposing the intermetallic catalyst on the substrate;

Step S3: providing a hydrogen flowing through the substrate, heating the substrate to a first temperature, and using the hydrogen to undergo a reduction of the intermetallic catalyst at the first temperature for 15~45 minutes;

Step S4: providing a protective gas and a carbon source gas, heating the substrate to a second temperature, allowing the protective gas and the carbon source gas to flow through the substrate, undergoing a reaction at the second temperature for 30~90 minutes, thereby allowing carbon atoms generated from pyrolysis of the carbon source gas to deposit at a bottom of the intermetallic catalyst, and gradually generating a 3D bundle-shaped multi-walled carbon nanotubes; after completion of the reaction at the second temperature, cooling to room temperature and collecting the 3D bundle-shaped multi-walled carbon nanotubes; wherein the inert gas comprises a Group 18 element, the second temperature is greater than or equal to the first temperature, and a volume mixing ratio of the protective gas and the carbon source gas is 1:6~1:12.

In this embodiment, the 3D bundle-shaped multi-walled carbon nanotubes are prepared via the thermal chemical vapor deposition method. To be more specific, the intermetallic catalyst is attached to the surface of the substrate, and a constant flow rate of 50 sccm (standard-state cubic centimeter per minute) is applied to the hydrogen, and after heating and maintaining the temperature at the first temperature, the hydrogen and the intermetallic catalyst then undergo the reduction reaction. The reduction reaction continues for 15~45 minutes. In this embodiment, the substrate comprises glass, quartz, ceramic, diamond, polyethylene terephthalate, polyethylene naphthalate or polyimide. In another embodiment, the heat treatment temperature is 100~180° C. In still another embodiment, the first temperature is 400~700° C.; and preferably, the first temperature is 600° C. After the reduction reaction is complete, a constant flow rate of 1000 sccm is applied to the inert gas in order to completely replace the hydrogen after the reduction reaction, and the intermetallic catalyst undergoes a passivation treatment, and to be more specific, the inert gas can be argon (Ar). After the gas replacement is complete, the temperature is increased to the second temperature and is maintained at such temperature, followed by cutting off the inert gas supply, and then applying the protective gas and the carbon source gas therein, in order to generate 3D bundle-shaped multi-walled carbon nanotubes through reaction at the second temperature. Next, after annealing treatment, the 3D bundle-shaped multi-walled carbon nanotubes are then collected.

In this embodiment, the second temperature is greater than or equal to the first temperature. In another embodiment, the second temperature is 550~900° C.; and preferably, the second temperature is 800° C. The volume mixing ratio of the protective gas and the carbon source gas is 1:6~1:12; and preferably, the volume mixing ratio of the protective gas and the carbon source gas is 1:9. The protective gas comprises hydrogen, nitrogen, ammonia or inert gases such as (He), neon (Ne), argon (Ar), krypton (Kr), xenon (Xe), radon (Rn); and preferably the protective gas is hydrogen. The carbon source gas comprises carbon monoxide (CO), methane ($CH_4$), acetylene ($C_2H_2$), ethane ($C_2H_6$), ethylene ($C_2H_4$), propylene ($C_3H_6$) or propyne ($C_3H_4$); and in a preferred embodiment, the carbon source gas is methane.

In this embodiment, the generation mechanism of the 3D bundle-shaped multi-walled carbon nanotubes refers to the apical growth. To be more specific, the carbon source gas undergoing the pyrolysis at high temperature is separated out gradually at the bottom of the intermetallic catalyst, and deposits and stacks to form carbon nanotube sections. The carbon nanotubes generated push the intermetallic catalyst out toward the direction away from the substrate. In this embodiment, the carbon nanotube sections separated out under the second temperature stacks at the bottom of intermetallic catalyst gradually, and then jointly forms the 3D bundle-shaped multi-walled carbon nanotubes together with adjacent carbon nanotube sections. The 3D bundle-shaped multi-walled carbon nanotubes formed are 3D bundle-shaped multi-walled carbon nanotubes of high purity without the need of any purification process. In addition, the 3D bundle-shaped multi-walled carbon nanotubes are 3D bundle-shaped multi-walled carbon nanotubes obtained through three-component nano-intermetallic alloy growth, such that its specific surface area is small than 100 $m^2/g$. In comparison to conventional activated carbon or graphene having a specific surface area above 800 $m^2/g$, the 3D bundle-shaped multi-walled carbon nanotubes prepared via the method of this embodiment of the present invention has a relatively smaller specific surface area.

In this embodiment, the intermetallic catalyst is prepared and obtained through heating process. To be more specific, after the bi-component alloy catalyst and the transition metal are mixed uniformly, heat treatment is performed within 180° C. to obtain the three-component intermetallic catalyst, and the heat treatment continues for 30~90 minutes; and in a preferred embodiment, the heat treatment continues for 60 minutes. In another embodiment, the alloy catalyst comprises platinum-ruthenium alloy (Pt—Ru), nickel-magnesium alloy (Ni—Mg), manganese-platinum alloy (Mn—Pt), cobalt-platinum alloy (Co—Pt) or manganese-cobalt alloy (Mn—Co). The transition metal element comprises Rhodium, palladium or molybdenum.

Figure 4:
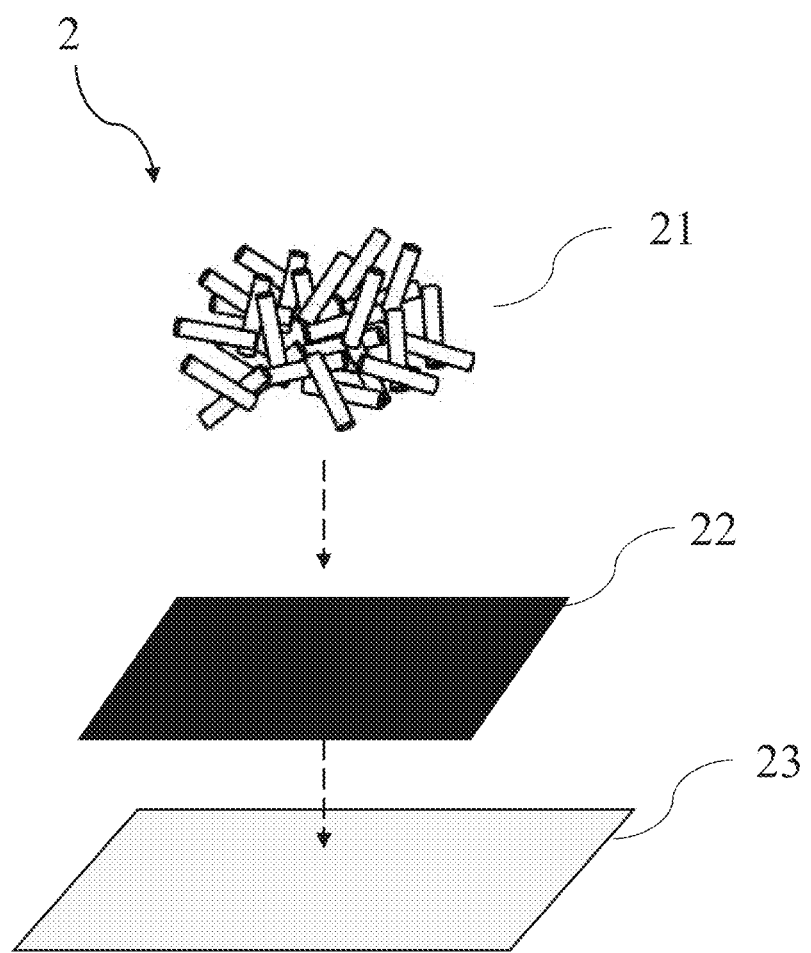
FIG. 4 is a structural view showing the composition element and corresponding relationship of the working electrode of the present invention.

In another embodiment of the present invention, a working electrode 2 is provided. Please refer to FIG. 4 showing a structural view of the working electrode 2, illustrating the corresponding relationship among the composition elements of the working electrode 2. The working electrode 2 comprises a conductive and drain material 23, a conductive bonding material 22 and a plurality of 3D bundle-shaped multi-walled carbon nanotubes 21; wherein the conductive bonding material 22 is disposed on top of the conductive and drain material 23, and the plurality of 3D bundle-shaped multi-walled carbon nanotubes 21 are disposed on top of the conductive bonding material 22. The conductive and drain material 23, the conductive bonding agent 22 and the plurality of 3D bundle-shaped multi-walled carbon nanotubes 21 are pressed and bonded to each other in order to form the working electrode 2. The conductive and drain material 23 is made of, such as, ITO conductive glass, FTO conductive glass, nickel foam net, lead plate, acid and alkali resistant carbon plate, conductive polymer composite material or stainless steel metal material. The conductive bonding agent comprises various types of carbon materials, such as carbon tape, carbon cloth, graphite felt, carbon felt, graphite paper, carbon paper, graphite brush or carbon brush; and in a preferred embodiment, the conductive bonding agent is carbon tape. In addition, in another embodiment, during the use of the working electrode 2, a conductive electrolyte is further, and the conductive electrolyte comprises liquid, colloid, quasi solid, all solid, aqueous solution, polymer electrolyte and provided during use of an energy storage device.

In this embodiment, a preparation method of the 3D bundle-shaped multi-walled carbon nanotubes 21 comprises: providing a bi-component alloy catalyst and a transition metal, mixing uniformly in an inert gas environment and performing a heat treatment for 30~90 minutes in order to obtain an intermetallic catalyst; providing a substrate, and disposing the intermetallic catalyst on the substrate; providing a hydrogen flowing through the substrate, heating the substrate to a first temperature, and using the hydrogen to undergo a reduction of the intermetallic catalyst at the first temperature for 15~45 minutes; providing a protective gas and a carbon source gas, heating the substrate to a second temperature, allowing the protective gas and the carbon source gas to flow through the substrate, undergoing a reaction at the second temperature for 30~90 minutes, thereby allowing carbon atoms generated from pyrolysis of the carbon source gas to deposit at a bottom of the intermetallic catalyst, and gradually generating a 3D bundle-shaped multi-walled carbon nanotubes; after completion of the reaction at the second temperature, cooling to room temperature and collecting the 3D bundle-shaped multi-walled carbon nanotubes; wherein the inert gas comprises a Group 18 element, the second temperature is greater than or equal to the first temperature, and a volume mixing ratio of the protective gas and the carbon source gas is 1:6~1:12.

In an embodiment of the present invention, the alloy catalyst comprises platinum-ruthenium alloy (Pt—Ru), nickel-cobalt alloy (Ni—Co), nickel-magnesium alloy (Ni—Mg), manganese-platinum alloy phase (Mn—Pt), cobalt-platinum alloy (Co—Pt) or manganese-cobalt alloy (Mn—Co); and the transition metal element comprises cadmium, rhodium, palladium, and molybdenum.

In an embodiment of the present invention, the substrate comprises glass, quartz, ceramic, diamond, polyethylene terephthalate, polyethylene naphthalate or polyimide.

In an embodiment of the present invention, the carbon source gas comprises carbon monoxide, methane, acetylene, ethane, ethylene, propylene or propyne; the protective gas contains hydrogen, nitrogen, ammonia or an inert gas, such as, helium (He), neon (Ne), argon (Ar), krypton (Kr), xenon (Xe), and radon (Rn).

In an embodiment of the present invention, the heat treatment temperature is 100~180° C.

In an embodiment of the present invention, the first temperature is 400~700° C.

In an embodiment of the present invention, the second temperature is 550~900° C.

Embodiment 1

In this embodiment, the three-component intermetallic catalyst is obtained by uniformly mixing the dry alloy catalyst Ni—Mg nano-intermetallic bi-component alloy powder and transition metal Mo precursor, followed by heat treatment for 60 minutes, and the product is a tree-component intermetallic catalyst Ni—Mo—Mg nano-intermetallic allow powder. Next, a substrate is placed inside the reactor. In this embodiment, quartz tube is used as the substrate. The 3 mg of intermetallic catalyst Ni—Mo—Mg is placed at the center location of the quartz tube. After the quartz tube is fastened, the internal of the quartz tube is evacuated. Once the internal of the quartz tube is evacuated, argon is applied and injected, and hydrogen at a constant flow rate of 50 sccm is also applied and is heated to 600° C., such that the intermetallic catalyst Ni—Mo—Mg undergoes reduction at 600° C. for 30 minutes. Next, change the hydrogen to argon, and then heat the substrate to 800° C., followed by applying the protective gas and carbon source gas at a constant flow rate of 1000 sccm therein. In this embodiment, the protective gas is hydrogen, and the carbon source gas is methane. The hydrogen and methane are mixed at a volume flow ratio of 1:9 and undergo reaction with the temperature maintained at 800° C. for 60 minutes. Once the reaction is complete, the mixed gas is changed to argon, then wait for the temperature to decrease to the room temperature, followed by collecting the 3D bundle-shaped multi-walled carbon nanotubes prepared completely.

Figure 5A:
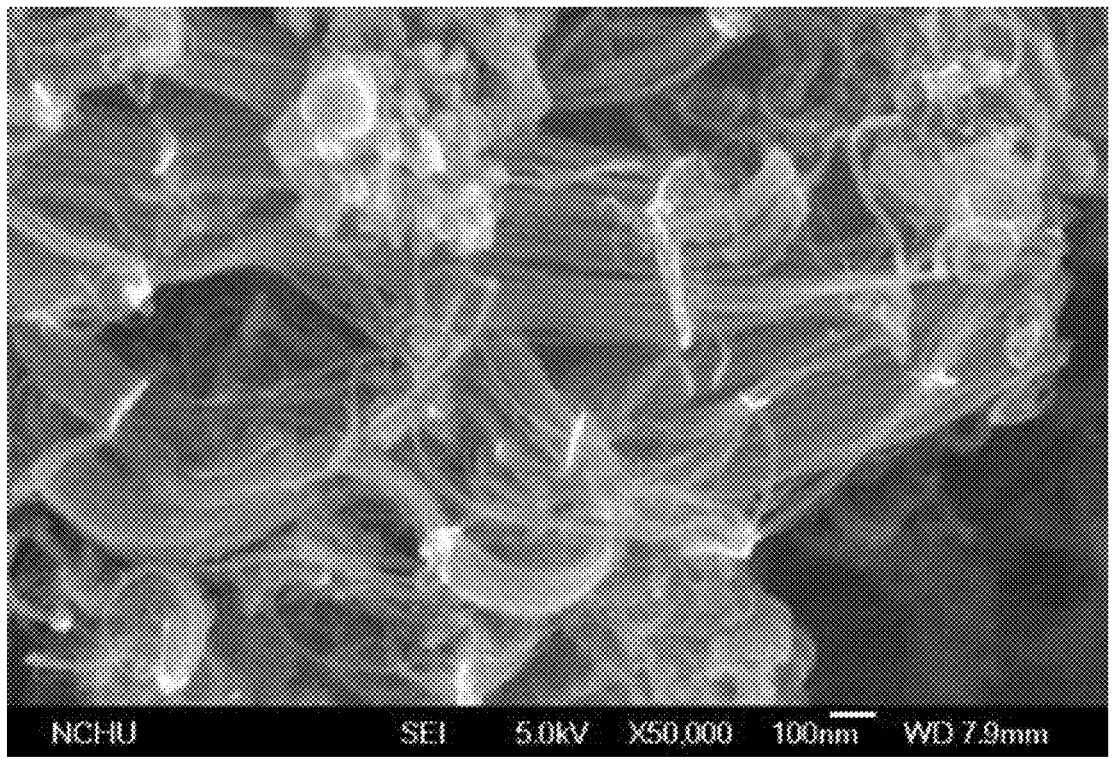
FIG. 5A is an electronic microscope image, showing an image of the 3D bundle-shaped multi-walled carbon nanotubes magnified by 50,000 times.
Figure 5B:
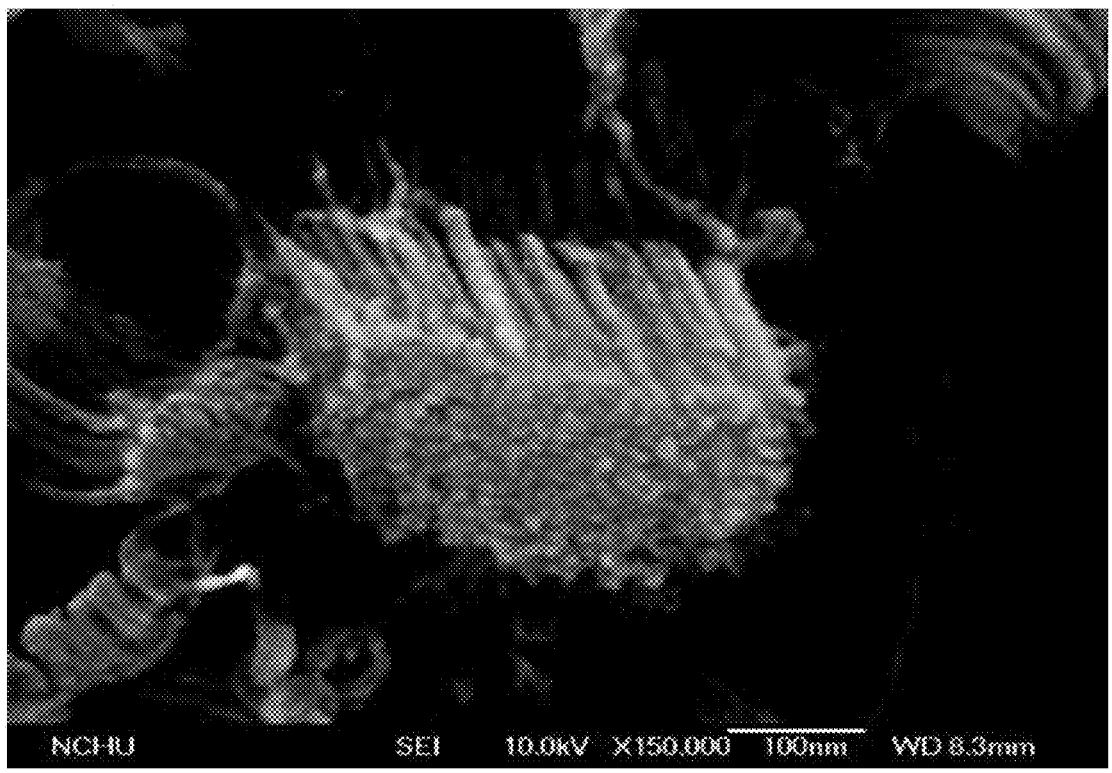
FIG. 5B is an electronic microscope image, showing an image of the 3D bundle-shaped multi-walled carbon nanotubes magnified by 150,000 times.

FIG. 5A shows an electronic microscope image of the 3D bundle-shaped multi-walled carbon nanotubes magnified by 50,000 times; FIG. 5B shows an electronic microscope image of the 3D bundle-shaped multi-walled carbon nanotubes magnified by 150,000 times. From FIG. 5A and FIG. 5B, the 3D bundle-shaped structure formed by a plurality of carbon nanotubes of the bundle-shaped carbon nanotubes prepared with the method described in this embodiment can been seen clearly.

Embodiment 2

In this embodiment, the 3D bundle-shaped multi-walled carbon nanotubes prepared according to the aforementioned Embodiment 1 are used to prepare a working electrode. The working electrode is formed by a conductive and drain material, a conductive bonding gent and a plurality of 3D bundle-shaped multi-walled carbon nanotubes. First, the conductive bonding agent is disposed on the conductive and drain material. In this embodiment, the conductive and drain material is ITO conductive glass, and the conductive bonding agent is carbon tape. Then, the plurality of 3D bundle-shaped multi-walled carbon nanotubes are disposed on the carbon tape. Finally, the ITO conductive glass, carbon tape and the plurality of 3D bundle-shaped multi-walled carbon nanotubes are pressed and bonded to form the working electrode.

Experiment Example 1

Figure 6:
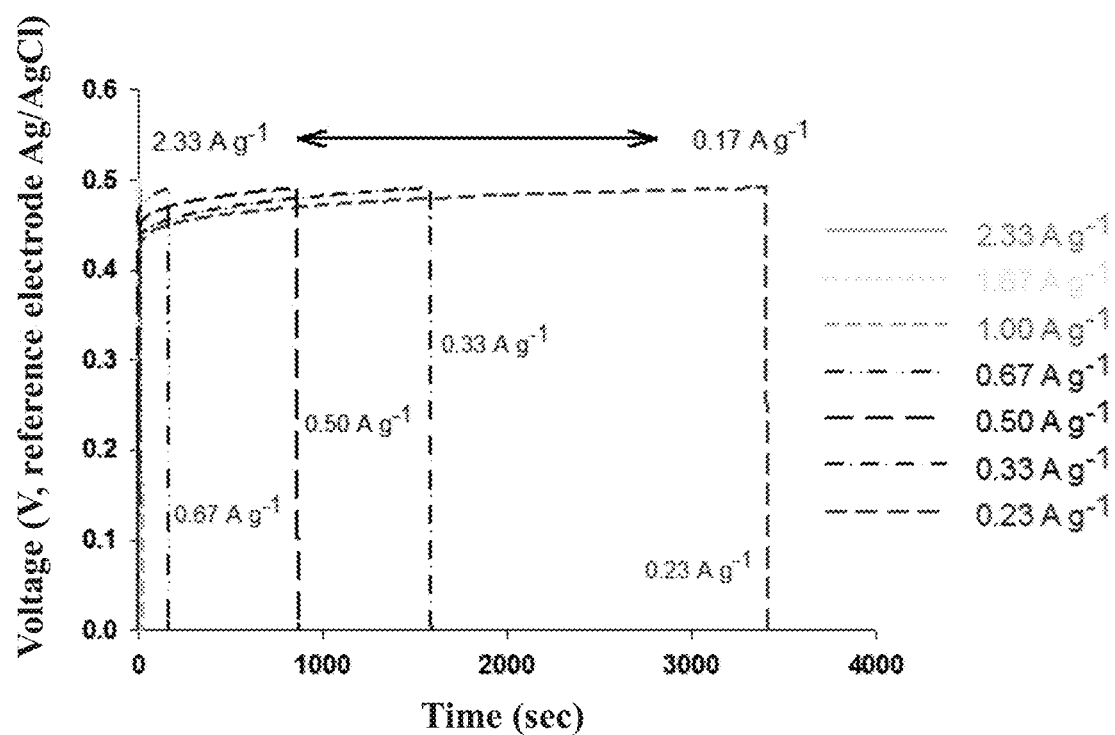
FIG. 6 is a curve graph illustrating the GCD of the working electrode prepared according to Embodiment 2 of the present invention in a constant-current charging/discharging.

For the working electrode prepared according to the method of Embodiment 2, constant-current charging/discharging analysis is performed. The present constant-current charging/discharging analysis is performed in the 3M NaOH $_{(aq)}$ electrolyte. Please refer to FIG. 6, showing the constant-current charging/discharging analysis result graph of Embodiment 2. In this analysis result, under the current density of 0.23 A/g, the maximum specific capacitance of Embodiment 2 is 1,560 F/g, and the energy density and power density reach 195 Wh/kg and 0.21 kW/kg respectively. Under the 2.33 A/g current density, the energy density and power density of Embodiment 2 reach 0.4 Wh/kg and 2.11 kW/kg respectively. The result indicates that under different current densities, Embodiment 2 prepared via the method of the present invention has high energy density and high power density trend and it also has high potential for being applied as a solid-state capacitor. The working electrode prepared according to Embodiment 2 of the present invention uses the 3D bundle-shaped multi-walled carbon nanotubes, and its specific surface area is relatively lower than the specific surface area of activated carbon or graphene. The aforementioned test result also demonstrates that the 3D structure formed via the 1D carbon tubes and 2D layered material root bonding has the potential of increasing the electrochemical performance, which is not a result of the factor of specific surface area.

Experiment Example 2

Figure 7A:
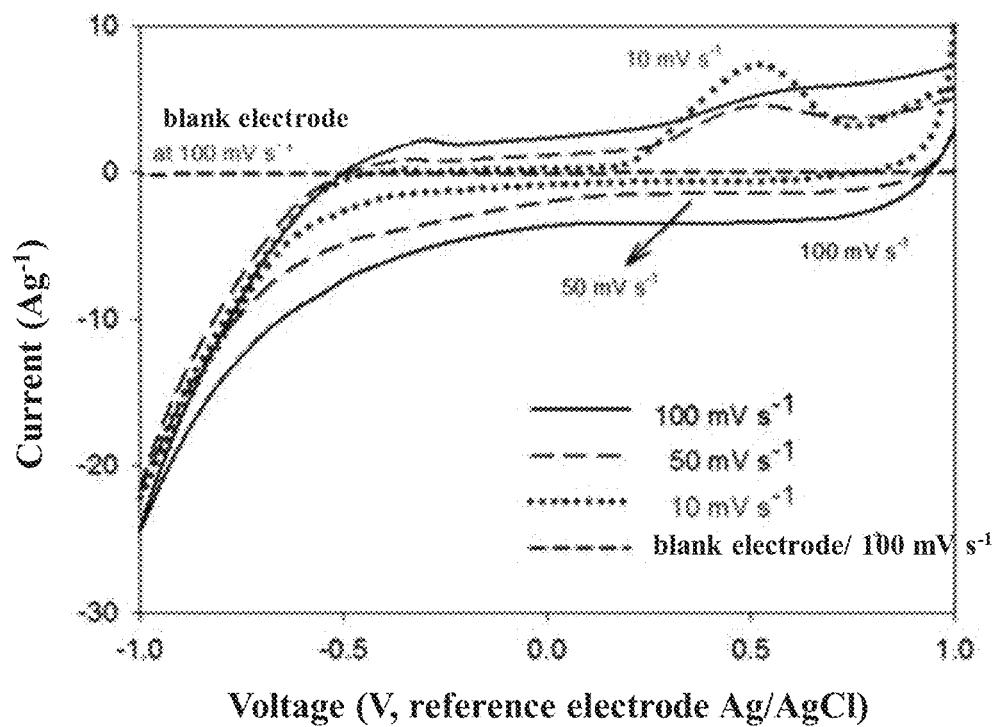
FIG. 7A is a curve graph illustrating the cyclic voltammetry analysis at voltage between −1.0 and 1.0V of the working electrode prepared according to Embodiment 2 of the present invention.

FIG. 7A is a curve graph illustrating the cyclic voltammetry analysis at voltage between −1.0 and 1.0V of the working electrode prepared according to Embodiment 2 of the present invention. In the cyclic voltammetry analysis of this experiment, the silver/silver chloride (Ag/AgCl) is used as the reference electrode, and the metal of platinum (Pt) is used as the counter electrode; however, the present invention is not limited to such materials only. The test of the cyclic voltammetry is performed in the 3M $NaOH_{(aq)}$ electrolyte, and the scanning rate of 10, 50 and 100 mV/s are respectively used to measure the induced current when the voltage of the working electrode decreases from 1.0V to −1.0V and when the voltage increases from −1.0V to 1.0V, and the result is as shown in FIG. 7A. FIG. 7A shows the measurement result of the working electrode according to Embodiment 2. From FIG. 7A, it can be understood that when a blank electrode is without the attachment of the 3D bundle-shaped multi-walled carbon nanotubes, nearly no capacitance is generated, such that the capacitance of the blank electrode can be ignored. The oxidation peak of the current generated at 0.52V is caused by the oxidation of aqueous solvent. Under different scanning rate, the curve shapes presented by the induced current are similar. In other words, for condition where the scanning rate of 10 mV/s is increased by 10 times to 100 mV/s, the current curve loop measured still shows no distortion. It means that the working electrode of Embodiment 2 has the reversibility in terms of the oxidation/reduction electrochemical reaction, and it also exhibits the characteristic of electric double layer capacitor.

Experiment Example 3

Figure 7B:
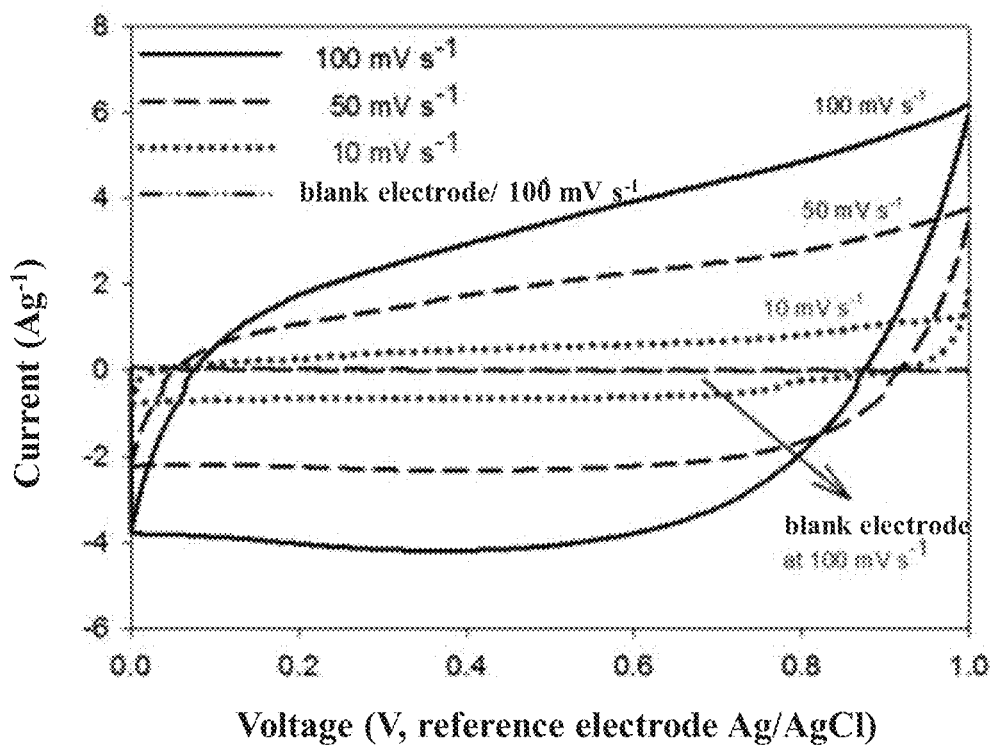
FIG. 7B is a curve graph illustrating the cyclic voltammetry analysis at voltage between 0 and 1.0V of the working electrode prepared according to Embodiment 2 of the present invention.

FIG. 7B is a curve graph illustrating the cyclic voltammetry analysis at voltage between 0V and 1.0V of the working electrode prepared according to Embodiment 2 of the present invention. Similarly, the silver/silver chloride (Ag/AgCl) is used as the reference electrode, and the metal of platinum (Pt) is used as the counter electrode; however, the present invention is not limited to such materials only. The test of the cyclic voltammetry is performed in the 3M $NaOH_{(aq)}$ electrolyte, and the scanning rate of 100 mV/s is used to measure the induced current when the voltage of the working electrode decreases from 1.0V to 0V and when the voltage increases from 0V to 1.0V, and the result is as shown in FIG. 7B. FIG. 7B shows the measurement result of the working electrode according to Embodiment 2. From FIG. 7B, it can be seen that, under the scanning rate of 100 mV/s, when a blank electrode is without the attachment of the 3D bundle-shaped multi-walled carbon nanotubes, nearly no capacitance is generated, such that the capacitance of the blank electrode can be ignored. The inducted current curve presented by the working electrode of Embodiment 2 indicates that the current loop measured resembles a rectangular shape, which clearly indicates that the working electrode of Embodiment 2 has the characteristic of electric double layer capacitor under electrochemical reaction.

Experiment Example 4

In this embroilment, the working electrode prepared according to Embodiment 2 is used to perform the electrochemical AC impedance spectroscopy (EIS) analysis. EIS is to measure the battery electrode behavior and to analyze the material electrical impedance, which utilizes AC impedance spectrum analyzer to obtain the AC impedance Nyquist plot in order to analyze the possible electrochemical reaction dynamics possibly occurred at the internal of the battery.

Figure 8:
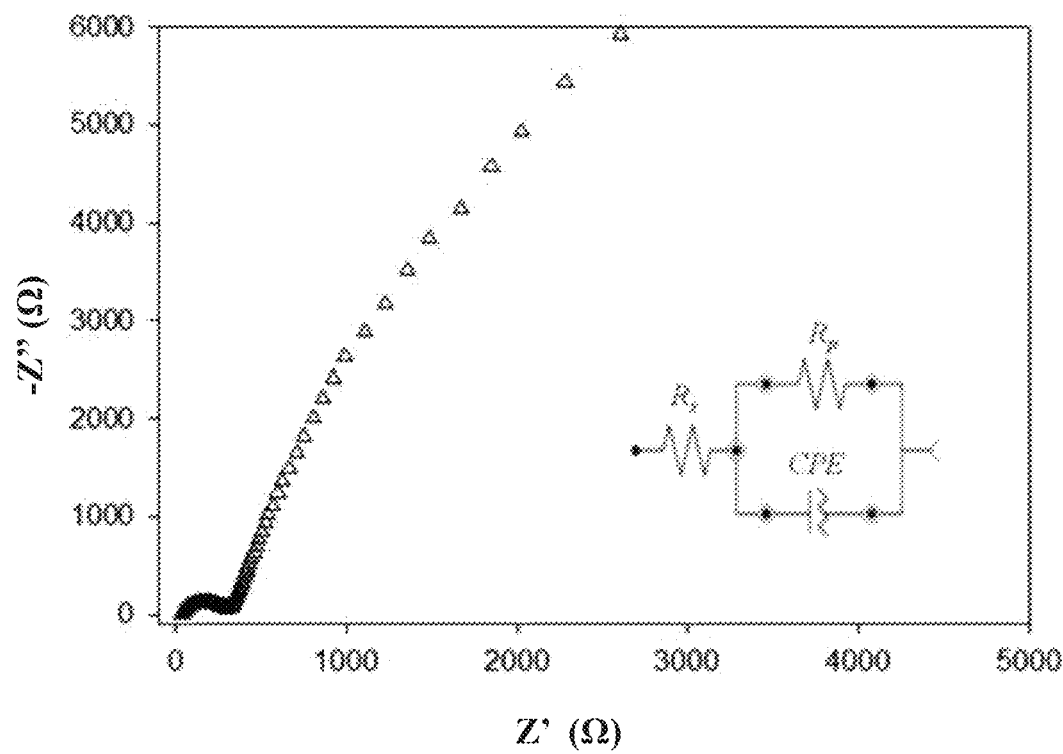
FIG. 8 is a trend graph illustrating the AC impedance analysis of the working electrode prepared according to Embodiment 2 of the present invention.

Please refer to FIG. 8 illustrating the AC impedance spectroscopy of the working electrode prepared according to Embodiment 2. From FIG. 8, it can be seen that the Nyquist plot of the working electrode at high frequency area shows a semi-circle shape, indicating that the semi-circle impedance curve related to small frequency. In addition, at the medium frequency and low frequency, it shows a vertical straight line, indicating that the working electrode exhibits excellent electric double layer capacitor and fast ion diffusion characteristic.

The fast ion diffusion in the working electrode may be due to the 3D micro-structure formed by the 3D bundled-shaped multi-walled carbon nanotubes and the three-component intermetallic alloy. The 3D micro-structure forms an excellent porous diffusion channel and increases the efficiency of the electrolyte ion migration, thereby increasing the direct contact between the activated material and the electrolyte in the electrode, such that the limitation of the ion diffusion is reduced.

Furthermore, the equivalent circuit diagram includes the $R_s$, $R_{ct}$ and constant phasing element (CPE) in parallel with the actual capacitor. In addition, please refer to FIG. 8 again. From the AC impedance analysis of this experiment example, it can be seen that the battery according to Embodiment 2 is measured to have low $R_s$, meaning that the working electrode is able to operate while being driven by an extremely low voltage. Furthermore, from the AC impedance analysis of this embodiment, it can be understood that Embodiment 2 with the 3D bundle-shaped multi-walled carbon nanotubes prepared according to the preparation of the present invention has low equivalent series resistance, and it is due to the porous structure of the 3D bundle-shaped multi-walled carbon nanotubes formed on the working electrode, such that the electrolyte ion diffusion transfer is smooth, and the electrochemical activated substance can be conducted more easily, thereby achieving the effect of low impedance and high conductivity.

Experiment Example 5

Figure 9:
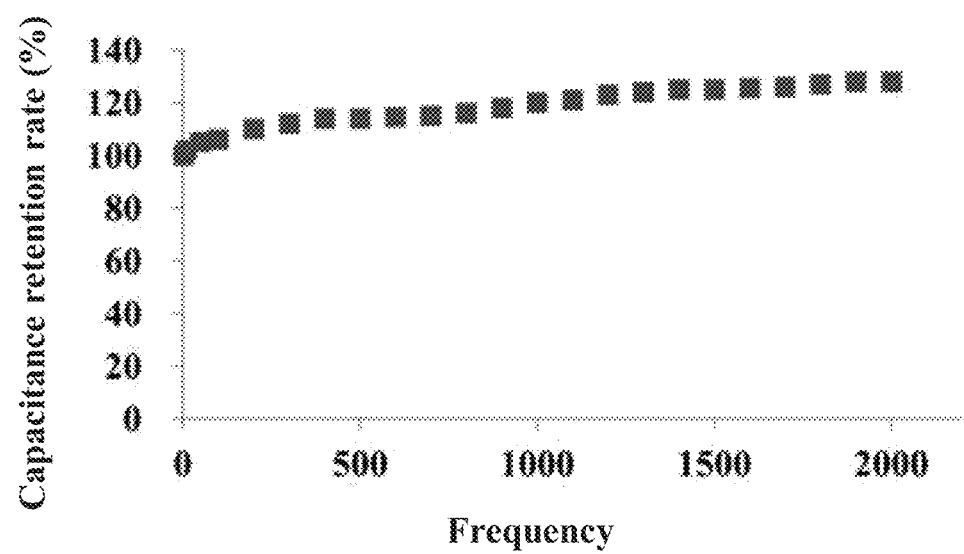
FIG. 9 is a trend graph illustrating the capacitance retention rate percentage of the working electrode prepared according to Embodiment 2 of the present invention obtained after the CV cycle at constant current.

In this experiment example, the battery equipped with the working electrode of Embodiment 2 undergoes 2,000 times of CV cycle under the current density of 1.67 A/g. Please refer to 9, illustrating the capacitance retention rate percentage of the working electrode prepared according to Embodiment 2 of the present invention obtained after the CV cycle at constant. From FIG. 9, it can be understood that the specific capacitance retention rate of the working electrode is clearly increased in the CV cycle, and it is increased by 128%, demonstrating that the working electrode provided by the present invention, under the cyclic charging and discharging condition, is able to maintain its original specific capacitance, and the specific capacitance is also increased. This is resulted from the gradually wetted interface between the working electrode and the electrolyte, and the 3D bundle-shaped multi-walled carbon nanotube structure having greater area for electrolyte ions, such that the composite electrode material prepared has low ion resistance, and the electrolyte ions are able to mitigate swiftly among the 3D bundle-shaped multi-walled carbon nanotube structure. Furthermore, the 3D bundle-shaped multi-walled carbon nanotube structure composite electrode demonstrates excellent conductivity and low charge-transfer impedance, such that it facilitates the charge fast transfer between the composite electrode material and the electrolyte.

The 3D bundle-shaped multi-walled carbon nanotubes produced via the preparation method of the present invention have at least the following merits:

1. The nano-intermetallic alloy catalyst prepared in the present invention requires a simple process method only, such that it does not require the high energy consumption process of calcination under high temperature or high pressure; instead, it can be obtained via uniform mixing and simple heating process in an inert gas environment.
2. The 3D bundle-shaped multi-walled carbon nanotubes prepared via the method of the present invention are 3D bundle-shaped multi-walled carbon nanotubes produced through three-component nano-intermetallic alloy growth, and its specific surface area is approximately 95.3 $m^2/g$; in general, it is at least 800 $m^2/g$ or more less than the specific surface area of activated carbon or graphene. Accordingly, the 3D bundle-shaped multi-walled carbon nanotubes prepared via the method of the present invention is equipped with a specific surface area much smaller than that of regular activated carbon or graphene.
3. The 3D bundle-shaped multi-walled carbon nanotubes prepared via the method of the present invention refer to the bottom root attachment between 1D bundle-shaped multi-walled carbon nanotubes and 2D layered alloy material, such that the conductivity of the multi-walled carbon nanotubes and layered alloy material is increased and the electric double layer ion distribution storage efficiency is increased, thereby effectively and significantly increase the electrode capacitance and energy density.
4. For the working electrode produced from the 3D bundle-shaped multi-walled carbon nanotubes prepared via the method of the present invention, during the charging/discharging test at constant current, it demonstrates excellent energy density and power density; therefore, the 3D bundle-shaped multi-walled carbon nanotubes prepared via the method of the present invention has the potential to be served as solid-state capacitor.
5. The 3D bundle-shaped multi-walled carbon nanotubes prepared via the method of the present invention is equipped with the synergistic effect of nano-structure and excellent mechanical stability along with high conductivity and is also equipped with layered structure, such that it is able to increase the electric double layer storage effect and is able to effectively increase the ion diffusion rate. Furthermore, during the charging/discharging process, the volume change is small, thereby significantly increasing the electrode capacitance and energy density performance of 3D bundle-shaped multi-walled carbon nanotubes.
6. The composite electrode specific capacitance retention rate of the 3D bundle-shaped multi-walled carbon nanotubes composite electrode prepared via the method of the present invention is higher than the initial specific capacitance retention rate, demonstrating excellent conductivity and low charge-transfer resistance, low ion resistance and promoting fast migration of electrolyte ions in the conductive 3D bundle-shaped multi-walled carbon nanotubes structure, thereby facilitating the fast charge transfer between the 3D bundle-shaped multi-walled carbon nanotubes composite electrode material and electrolyte.
7. For the composite working electrode of the 3D bundle-shaped multi-walled carbon nanotubes prepared via the method of the present invention, during the charging/discharging test at constant current, it demonstrates excellent energy density, power density and cycle use capacitance retention rate. In view of the, above, the 3D bundle-shaped multi-walled carbon nanotubes prepared via the method of the present invention have relatively high application potential to be used as supercapacitor, electric double layer capacitor, quasi capacitor, all-solid state capacitor and relevant energy storage element and electric core material.

It shall be understood that the descriptions of the aforementioned embodiments provided are provided to illustrate the possible embodiments of the present invention only, and a person skilled in the art in the technical field of the present invention may perform any types of modification. The above description and embodiments are provided as examples illustrating the process and the purposes of possible embodiments of the present invention in detail. Despite that the embodiments disclose specific embodiments of the present invention, they shall not be treated as limitations of the present invention. A person skilled in the art in the technical field of the present invention may made any types of changes and modifications without deviating from the principle and concept of the present invention. Accordingly, the protection scope of the present invention shall be based on the scope of the claim.

The structural characteristics of the present invention defined in the claims are not seen in objects of the same kind, and its utility and inventive step have complied with the patentability of invention patent. Accordingly, an application is hereby submitted according to the laws, and the Office is requested to grant the patent right according to the laws in order to protect the rights and interests of the applicant.

What is claimed is:

1. A preparation method of 3D bundle-shaped multi-walled carbon nanotubes, comprising:
    Step S1: providing a bi-component alloy catalyst and a transition metal element, mixing uniformly in an inert gas environment and performing a heat treatment for 30~90 minutes in order to obtain an intermetallic catalyst;
    Step S2: providing a substrate, and disposing the intermetallic catalyst on the substrate;
    Step S3: providing a hydrogen flowing through the substrate, heating the substrate to a first temperature, and using the hydrogen to undergo a reduction of the intermetallic catalyst at the first temperature for 15~45 minutes;
    Step S4: providing a protective gas and a carbon source gas, heating the substrate to a second temperature, allowing the protective gas and the carbon source gas to flow through the substrate, undergoing a reaction at the second temperature for 30~90 minutes, thereby allowing carbon atoms generated from pyrolysis of the carbon source gas to deposit at a bottom of the intermetallic catalyst, and gradually generating a 3D bundle-shaped multi-walled carbon nanotubes; after completion of the reaction at the second temperature, cooling to room temperature and collecting the 3D bundle-shaped multi-walled carbon nanotubes;
    wherein the inert gas comprises a Group 18 element, the second temperature is greater than or equal to the first temperature, and a volume mixing ratio of the protective gas and the carbon source gas is 1:6~1:12.

2. The preparation method according to claim 1, wherein the bi-component alloy catalyst comprises platinum-ruthenium alloy (Pt—Ru), nickel-cobalt alloy (Ni—Co), nickel-magnesium alloy (Ni—Mg), manganese-platinum alloy phase (Mn—Pt), cobalt-platinum alloy (Co—Pt) or manganese-cobalt alloy (Mn—Co).

3. The preparation method according to claim 2, wherein the transition metal element comprises cadmium, rhodium, palladium, or molybdenum.

4. The preparation method according to claim 1, wherein the substrate comprises glass, quartz, ceramic, diamond, polyethylene terephthalate, polyethylene naphthalate or polyimide.

5. The preparation method according to claim 1, wherein the carbon source gas comprises carbon monoxide, methane, acetylene, ethane, ethylene, propylene or propyne.

6. The preparation method according to claim 1, wherein the protective gas contains hydrogen, nitrogen, ammonia or an inert gas.

7. The preparation method according to claim 6, wherein the inert gas contained in the protective gas contains helium (He), neon (Ne), argon (Ar), krypton (Kr), xenon (Xe), or radon (Rn).

8. The preparation method according to claim 1, wherein the heat treatment temperature is 100~180° C.

9. The preparation method according to claim 1, wherein the first temperature is 400~700° C., and the second temperature is 550~900° C.

10. A working electrode, comprising:
a conductive and drain material;
a conductive bonding material disposed on top of the conductive and drain material; and
a plurality of 3D bundle-shaped multi-walled carbon nanotubes prepared according to the preparation method of claim 1 and disposed on top of the conductive bonding material.

11. The working electrode according to claim 10, wherein the conductive and drain material is made of ITO conductive glass, FTO conductive glass, nickel foam net, lead plate, acid and alkali resistant carbon plate, conductive polymer composite material or stainless steel metal material.

12. The working electrode according to claim 10, wherein the conductive bonding material comprises carbon tape, carbon cloth, graphite felt, carbon felt, graphite paper, carbon paper, graphite brush, carbon brush, conductive glue, conductive silver glue or conductive polymer.

13. The working electrode according to claim 10, wherein the working electrode further comprises a conductive electrolyte provided during use of the working electrode; the conductive electrolyte comprises liquid, colloid, quasi solid, all solid, aqueous solution, or polymer electrolyte; and provided during use of an energy storage device.

* * * * *